(12) United States Patent  (10) Patent No.: US 9,130,527 B2
Potard  (45) Date of Patent: Sep. 8, 2015

(54) METHOD AND SYSTEM FOR CONTROLLING DISTORTION IN A CRITICAL FREQUENCY BAND OF AN AUDIO SIGNAL

(75) Inventor: Guillaume Potard, Bundeena (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 313 days.

(21) Appl. No.: 13/814,615

(22) PCT Filed: Aug. 11, 2011

(86) PCT No.: PCT/US2011/047333
§ 371 (c)(1),
(2), (4) Date: Feb. 6, 2013

(87) PCT Pub. No.: WO2012/024144
PCT Pub. Date: Feb. 23, 2012

(65) Prior Publication Data
US 2013/0142360 A1  Jun. 6, 2013

Related U.S. Application Data

(60) Provisional application No. 61/401,746, filed on Aug. 18, 2010.

(51) Int. Cl.
*H03G 3/20* (2006.01)
*H03G 9/18* (2006.01)
*H04S 7/00* (2006.01)

(52) U.S. Cl.
CPC . *H03G 3/20* (2013.01); *H03G 9/18* (2013.01); *H04S 7/301* (2013.01)

(58) Field of Classification Search
CPC ............. H03G 3/20; H03G 9/18; H04S 7/301
USPC ........... 257/140; 330/2, 10; 331/77; 375/224; 379/387.01, 406.14; 381/13, 55, 93, 381/96, 98, 104, 106, 121, 191, 345; 700/94; 181/287
See application file for complete search history.

(56) References Cited

U.S. PATENT DOCUMENTS 6,512,788 B1 * 1/2003 Kuhn et al. .................... 375/224
6,584,204 B1 * 6/2003 Al-Ali et al. .................... 381/96
(Continued)

FOREIGN PATENT DOCUMENTS

| CN | 101426169 | 5/2009 |
| JP | 2-280600 | 11/1990 |

(Continued)

OTHER PUBLICATIONS

Lashkari, K. "A Novel Volterra-Wiener Model for Equalization of Loudspeaker Distortions" ICASSP 2006, V-117-V-120.

*Primary Examiner* — Gerald Gauthier

(57) ABSTRACT

In some embodiments, a method and system for controlling distortion of the output of a miniature speaker by attenuating critical frequency band of the input signal to be reproduced, using tuning parameters that have been predetermined where the critical frequency band is a frequency range of the speaker's frequency response in which Total Harmonic Distortion (THD) peaks. The distortion control is performed in a manner which allows an increase in the average loudness of the speaker's output without significantly increasing distortion. The tuning parameters include a center frequency and a bandwidth of the critical frequency band, and a power threshold value. In some embodiments, the system is a loudness maximizer configured to limit distortion of a speaker's output by limiting distortion in a critical frequency band using predetermined control parameters, and limit the dynamic range of the output signal and increase its perceived overall average loudness level.

20 Claims, 5 Drawing Sheets

(56) References Cited

U.S. PATENT DOCUMENTS

| | | | |
|---|---|---|---|
| 6,914,987 B2* | 7/2005 | Blind et al. | 381/13 |
| 7,202,731 B2* | 4/2007 | Krochmal et al. | 330/2 |
| 7,279,967 B2* | 10/2007 | Quilter | 330/10 |
| 7,359,519 B2* | 4/2008 | Lee et al. | 381/59 |
| 7,574,010 B2* | 8/2009 | Forrester et al. | 381/104 |
| 7,600,608 B2* | 10/2009 | Freiheit | 181/287 |
| 7,873,427 B1* | 1/2011 | Rhea | 700/94 |
| 8,175,302 B2* | 5/2012 | Tanghe et al. | 381/191 |
| 8,183,941 B2* | 5/2012 | Delbecq et al. | 331/77 |
| 8,213,598 B2* | 7/2012 | Bendersky et al. | 379/406.14 |
| 8,600,076 B2* | 12/2013 | Choi et al. | 381/106 |
| 8,638,968 B2* | 1/2014 | Gladwin | 381/345 |
| 8,660,259 B2* | 2/2014 | Frandsen | 379/387.01 |
| 8,750,525 B2* | 6/2014 | Martz et al. | 381/55 |
| 8,787,598 B2* | 7/2014 | Berg | 381/121 |
| 2009/0321784 A1* | 12/2009 | Anderson et al. | 257/140 |
| 2011/0064232 A1* | 3/2011 | Ruwisch | 381/59 |
| 2011/0301731 A1* | 12/2011 | Okimoto et al. | 700/94 |
| 2012/0281855 A1* | 11/2012 | Kitago et al. | 381/93 |
| 2013/0013096 A1 | 1/2013 | Seefeldt | |
| 2013/0142360 A1* | 6/2013 | Potard | 381/98 |

FOREIGN PATENT DOCUMENTS

| | | |
|---|---|---|
| JP | 2005-175674 | 6/2005 |
| JP | 2008-278487 | 11/2008 |
| JP | 2008-292613 | 12/2008 |
| JP | 2011-517909 | 6/2011 |
| WO | 2007/016527 | 2/2007 |

\* cited by examiner

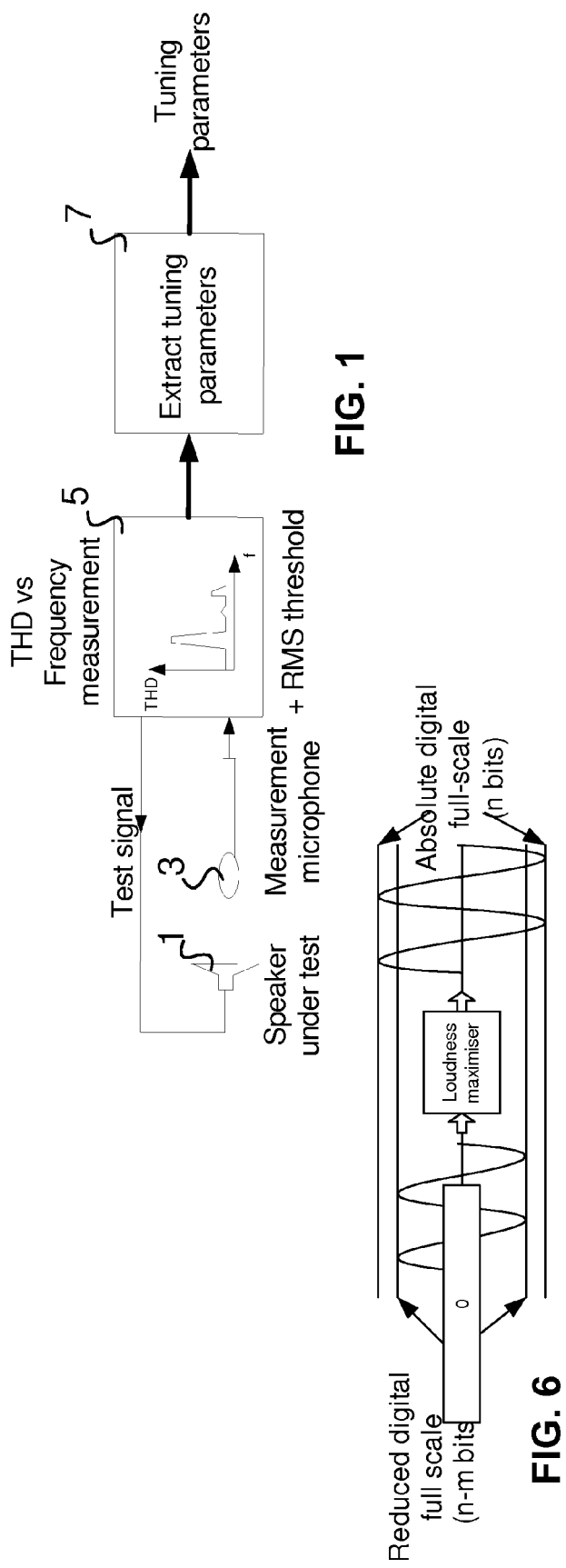
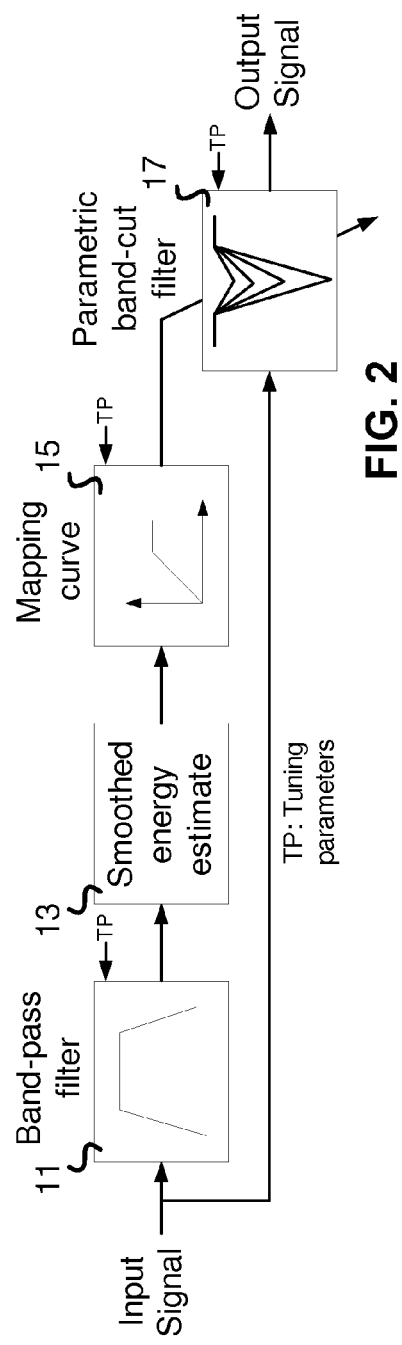
FIG. 1
FIG. 2
FIG. 6

METHOD AND SYSTEM FOR CONTROLLING DISTORTION IN A CRITICAL FREQUENCY BAND OF AN AUDIO SIGNAL

CROSS-REFERENCE TO RELATED APPLICATIONS

This application is the U.S. national stage of International Application PCT/US2011/047333, filed 11 Aug. 2011, which in turn claims priority to U.S. Provisional Patent Application No. 61/401,746, filed 18 Aug. 2010, each of which are hereby incorporated by reference in its entirety.

BACKGROUND OF THE INVENTION

1. Field of the Invention

The invention relates to methods and systems for controlling distortion of sound emitted by a speaker. In typical embodiments, distortion is controlled by limiting distortion in a critical frequency band (of the audio signal being reproduced) in which total harmonic distortion is likely to occur, using control parameters that have been predetermined in a speaker measurement operation.

2. Background of the Invention

Throughout this disclosure including in the claims, the expression performing an operation (e.g., filtering or compression) "on" signals or data is used in a broad sense to denote performing the operation directly on the signals or data, or on processed versions of the signals or data (e.g., on versions of the signals that have undergone preliminary filtering prior to performance of the operation thereon). Similarly, the expression "applying a filter to" a signal is used in a broad sense to denote applying the filter directly to the signal, or to a processed version of the signal (e.g., on a version of the signal that has undergone preliminary attenuation or other filtering prior to application of the relevant filter thereto).

Throughout this disclosure including in the claims, the expression "system" is used in a broad sense to denote a device, system, or subsystem. For example, a subsystem that determines a filter may be referred to as a filter system, and a system including such a subsystem (e.g., a system including a loudspeaker and means for applying the filter in the loudspeaker's signal path, as well as the subsystem that determines the filter) may also be referred to as a filter system.

Throughout this disclosure including in the claims, the terms "speaker" and "loudspeaker" are used synonymously to denote any sound-emitting transducer.

Throughout this disclosure including in the claims, the expression "reproduction" of a signal (e.g., an "input" signal or an "input audio" signal) by a speaker denotes causing the speaker to produce sound in response to the signal, including by performing any required amplification and/or other processing of the signal.

Mobile phone speakers and other miniature speakers often exhibit large amounts of distortion which limit the maximum volume at which they can play back audio in a pleasant manner for the user. The output of any speaker is subject to distortion, e.g., when the speaker is driven excessively at frequencies in a range in which total harmonic distortion (THD) peaks (i.e., exhibits a local maximum).

Until the present invention it had not been known how to limit distortion of the output of a speaker (e.g., a miniature speaker) in a computationally efficient manner by limiting distortion in a critical frequency band (of the audio signal being reproduced) in which THD peaks, using control parameters that have been predetermined in a speaker measurement operation.

Throughout this disclosure including in the claims, each of the expressions "total harmonic distortion" and "THD" (of a signal) is used in a broad sense to denote the total harmonic distortion of the signal (in the sense well known in the art) or any value (e.g., any measured value) indicative of an estimate of the signal's total harmonic distortion. An example of a signal's "THD" (as used herein) is a measurement indicative of THD plus noise (THD+N) of the signal.

It has been proposed to employ other techniques (e.g., Volterra-Wiener modeling) to limit speaker distortion but those techniques typically demand a high level of computational complexity and thus cannot be implemented in a practical manner on portable sound devices such as cell phones or in other applications that require a high degree of computational efficiency.

Typical embodiments of the inventive distortion control system are useful in combination with a compressor and/or a limiter to increase the average (e.g., RMS) power of the output of a speaker while preventing digital clipping. A compressor limits overall dynamic range of an audio signal to be reproduced, typically by detecting signal level (averaged over some time) and amplifying the signal by a time-varying amount whose instantaneous value is determined by the corresponding detected level. One type of compressor, known as an RMS compressor, detects RMS power of the signal and amplifies the signal by a time-varying amount whose instantaneous value is determined by the corresponding detected RMS power. A limiter scans for peaks in an audio signal to be reproduced, and attenuates the signal at (or around) each peak, typically in a manner that prevents clipping. A "compressor/limiter" includes a compressor stage in sequence with a limiter stage (typically, the limiter stage follows the compressor stage in the signal processing chain).

The use of a compressor or compressor/limiter can ensure sure that even quiet content (which does not utilize the digital PCM domain optimally) sounds loud and clear on a mobile phone speaker (or other speaker). For already loud content (that is, content which utilizes the digital PCM domain optimally, such as some recently mixed pop music), the compressor (or compressor/limiter) should not modify the audio significantly so as not to cause undue digital distortion.

Herein, we use the expression "loudness maximizer" to denote a system, typically including a compressor and/or a limiter, configured to limit the dynamic range of a reproduced audio signal and to increase the perceived overall average loudness level of the reproduced audio signal, preferably without introducing audible undesirable processing artifacts.

Until the present invention, it had not been known how to implement a loudness maximizer to limit distortion of the output of a speaker (e.g., a miniature speaker) in a computationally efficient manner by limiting distortion in a critical frequency band (of the audio signal being reproduced) in which THD peaks, using control parameters that have been predetermined in a speaker measurement operation. In a class of embodiments, the present invention is a loudness maximizer which includes an embodiment of the inventive distortion control system, and optionally also at least one of a compressor (e.g., an RMS compressor), a speaker equalization (EQ) correction module, a bass boost module, and a limiter. If present, the limiter is typically implemented as the final stage in the signal processing chain.

BRIEF DESCRIPTION OF THE INVENTION

In a class of embodiments, the invention is a method for controlling distortion of the output of a speaker (e.g., a mobile phone speaker or other miniature speaker) by attenuating at least one critical frequency band of the input signal to be reproduced by the speaker, using control parameters (sometimes referred to herein as "tuning parameters") that have been predetermined (typically in a speaker measurement operation sometimes referred to herein as "tuning" operation). Herein, "critical frequency band" denotes a frequency range of the speaker's frequency response in which Total Harmonic Distortion (THD) peaks, in the sense that THD has a local maximum. For example, a critical frequency band may be a frequency range of the speaker's frequency response in which measured THD exceeds a predetermined threshold value, or in which measured THD peaks, or in which a quantity indicative of THD peaks or has a local minimum or maximum. Typically, the distortion control is performed in a manner which allows an increase in the average loudness (in the digital or analog domain) of the speaker's output without significantly increasing distortion of the emitted sound. Distortion control in accordance with typical embodiments can be tailored for speakers of any type by determining tuning parameters during a preliminary tuning operation which needs to be carried out only once for each type of speaker.

In some embodiments, a measurement operation is performed to determine tuning parameters indicative of a critical frequency band of the frequency response of a speaker whose distortion is to be controlled (e.g., or a speaker of the same type as the speaker whose distortion is to be controlled). Then, during operation of the speaker to reproduce an input signal, the input signal is attenuated in the critical frequency band using the tuning parameters. The tuning parameters typically include a center frequency and a bandwidth of the critical frequency band, and a power threshold value. The power threshold value is indicative of a minimum power (e.g. minimum average power, averaged over a time interval) of one or more frequency components in the critical frequency band of an input signal (to be reproduced by the speaker) which causes the THD of sound emitted by the speaker to exceed a predetermined threshold value. For example, the power threshold value may be indicative of a minimum value of the RMS power of a frequency component of the input signal in the critical frequency band (e.g., a frequency component having frequency equal to the center frequency of the critical band) which causes the THD of sound emitted by the speaker to exceed the predetermined threshold value. Attenuation of the input signal's critical frequency band in accordance with the invention limits the amount of distortion of the sound emitted by the speaker in a frequency range in which THD peaks.

The inventor has recognized that the frequency response of a mobile phone speaker (or other miniature speaker) typically has a critical frequency band (in which THD peaks) that occurs at the low-frequency roll-off point, and that the speaker typically resonates at a frequency in this critical frequency band. Thus, some embodiments of the inventive method assume that THD of a miniature speaker's output is likely to peak at the low-frequency roll-off point of the speaker's frequency response. These embodiments identify a critical frequency band in the speaker's frequency response as a band centered at the low-frequency roll-off point, and identify the center frequency and width of this band as tuning parameters for use in a processing operation to limit distortion of sound emitted by the speaker in the band.

To limit the distortion of sound emitted by a speaker, typical embodiments of the invention apply a band-cut filter (fixed or dynamic) to an input signal (being asserted to the speaker) to attenuate the input signal's energy in a critical frequency band. Thus, distortion of the speaker's output (which is expected to occur predominantly and/or most perceptibly in the critical frequency band) is reduced or avoided. This, in turn, allows the input signal to be further amplified outside the critical frequency band to increase the perceived loudness of the speaker's output without significantly increased distortion. By employing a time-varying band-cut filter of appropriate bandwidth and appropriate rate of change, audible artifacts caused by filtering in accordance with the invention (such as tonality changes of the input signal) are acceptably small (e.g., imperceptible).

In some embodiments, an input signal to a speaker is attenuated in each of two or more critical frequency bands, e.g., by being filtered in two or more band-cut filters (one centered at each critical band). In some embodiments, the input signal of each speaker of a multi-speaker system is attenuated in accordance with the invention (e.g., each channel of a multi-channel sound system is band-cut filtered to control distortion). If more than one speaker (e.g., each for reproducing a different audio channel) is included in an audio system, a measurement procedure can be performed individually for each of the speakers to determine tuning parameters for each such speaker (in accordance with some embodiments of the invention), or the average of each measured parameter for all the speakers can be used to determine one set of tuning parameters for all the speakers. Preferably, the input signal for each speaker is then filtered (during operation of the system to reproduce all the input signals) using the tuning parameters determined in the corresponding measurement procedure. In some embodiments, a measurement procedure is performed individually for each of several similar speakers to determine tuning parameters for one or more of the speakers (e.g., the average of each measured parameter for all the speakers is used to determine a set of tuning parameters for one the speakers).

In a second class of embodiments, the invention is a method for determining tuning parameters (e.g., band-cut filter control parameters) for use in attenuating frequency components (in a critical frequency band) of an input signal to control distortion of a speaker's output in response to the input signal, said method including steps of:

(a) identifying at least one critical frequency band of the speaker's frequency response, in which total harmonic distortion (THD) peaks;

(b) determining a center frequency of the critical frequency band and a bandwidth of the critical frequency band;

(c) determining a power threshold value indicative of a minimum power of at least one frequency component in the critical frequency band, of an input signal, which causes the THD of sound emitted by the speaker in response to the input signal to exceed a predetermined THD threshold value, wherein the tuning parameters include the center frequency of the critical frequency band, the bandwidth of the critical frequency band, and the power threshold value.

In some embodiments in the second class, step (a) includes a step of determining a THD curve indicative of THD of the speaker's output as a function of frequency (e.g., by performing a THD versus frequency measurement of the speaker) and identifying as the critical frequency band a frequency range of the THD curve in which THD exceeds a predetermined second THD threshold value. In some embodiments, the second THD threshold value is THD=x %, (e.g., x is equal to 10 or 15, or x is a value in the range from 10 to 15). In some embodiments, the THD threshold value (recited in step (c)) is equal to the second THD threshold value (recited in step (a)). In some embodiments, step (a) includes a step of identifying the critical frequency band of the speaker's frequency response to be a band in which measured THD exceeds a predetermined second THD threshold value, or in which measured THD peaks, or in which a quantity indicative of THD peaks or has a local minimum or maximum, where peaking of THD in this context denotes that THD has a local maximum.

In some embodiments in the second class, step (c) includes a step of performing a measurement to determine a power threshold value indicative of the minimum average power (averaged over a time interval) of the at least one frequency component in the critical frequency band which causes the THD of sound emitted by the speaker to exceed the THD threshold value. In some such embodiments, the power threshold value is a minimum value of the RMS power of a frequency component of the input signal in the critical frequency band (e.g., a frequency component having frequency equal to the center frequency of the critical frequency band) which causes the THD of sound emitted by the speaker to exceed the THD threshold value.

In a third class of embodiments, the invention is a method for filtering an input signal for a speaker using tuning parameters, to control distortion of the speaker's output, where the tuning parameters include a center frequency and a bandwidth of a critical frequency band of the speaker's frequency response in which total harmonic distortion (THD) peaks, and the tuning parameters also include a power threshold value indicative of a minimum power of at least one frequency component, in the critical frequency band, of an input signal to the speaker, which causes the THD of sound emitted by the speaker in response to the input signal to exceed a predetermined THD threshold value, said method including steps of:

(a) determining a band-pass filter, such that the band-pass filter has a pass band that is at least substantially centered at the center frequency of the critical frequency band (typically also, the pass band has a width determined by the bandwidth of the critical frequency band);

(b) applying the band-pass filter to the input signal to generate a band-pass filtered signal, and determining a time-averaged level (e.g., time-averaged power or energy) of the band-pass filtered signal;

(c) determining a band-cut filter, such that the band-cut filter has an attenuation band at least substantially centered at the center frequency of the critical frequency band (typically also, the attenuation band has a width determined by the bandwidth of the critical frequency band), and such that attenuation in the attenuation band is determined in response to the power threshold value such that, in response to a signal having said time-averaged level in the critical frequency band, the band-cut filter generates an attenuated signal having an attenuated time-averaged level in the critical frequency band that does not exceed the power threshold value; and (d) applying the band-cut filter to the input signal to generated a filtered signal whose frequency components in the critical frequency band are attenuated relative to the input signal's frequency components in the critical frequency band. Preferably, the frequency components of the filtered signal in the critical frequency band have a time-averaged level that does not exceed the power threshold value.

In typical embodiments in the third class, distortion of the speaker's output in response to the filtered signal is reduced significantly (e.g., perceptibly) relative to the distortion of the speaker's output that would otherwise occur in response to the input signal, because application of the band-cut filter attenuates frequency components of the filtered signal in the critical frequency band sufficiently to prevent them from causing the THD of sound emitted by the speaker to exceed the predetermined THD threshold value.

In typical embodiments in the third class, the input signal is amplified with a user-selectable gain (in response to user actuation of a volume control). Assuming that, when step (d) is not performed (so that the speaker's output is in response to the input signal rather than the filtered signal), the speaker's output in response to an input signal has a first amount of distortion when the input signal is amplified with a first gain, then typical embodiments of steps (a), (b), (c), and (d) allow average loudness (in the digital or analog domain) of the speaker's output in response to the filtered signal to be increased by amplifying the input signal with gain greater than the first gain (before performing steps (b) and (d)) without causing the speaker's output in response to the filtered signal to have distortion significantly greater than the first amount of distortion.

In typical embodiments in the third class, the band-cut filter determined in step (c) varies over time, in response to variation of the time-averaged level of the band-pass filtered signal over time.

In typical embodiments in the third class, step (b) includes the step of measuring level of the band-pass filtered signal (e.g., level of at least one frequency component of the band-pass filtered signal in the critical frequency band) on a time frame basis to determine said time-averaged level (e.g., determining a running average of power or energy of the band-pass filtered signal over a frame of predetermined duration). In some embodiments, the frame may have a duration substantially equal to 20 ms, for example. Preferably, step (b) includes steps of measuring level of the band-pass filtered signal on a time frame basis to determine a raw, time-averaged level, and smoothing the raw, time-averaged level with predetermined attack and release time constants to determine said time-averaged level.

In a fourth class of embodiments, the invention is a method for filtering an input signal for a speaker to control distortion of the speaker's output, said method including the steps of:

(a) identifying at least one critical frequency band of the speaker's frequency response, in which total harmonic distortion (THD) peaks, and determining a center frequency of the critical frequency band and a bandwidth of the critical frequency band;

(b) determining a power threshold value indicative of a minimum power of at least one frequency component in the critical frequency band, of an input signal, which causes the THD of sound emitted by the speaker in response to the input signal to exceed a predetermined THD threshold value;

(c) determining a band-pass filter, such that the band-pass filter has a pass band that is at least substantially centered at the center frequency of the critical frequency band (typically also, the pass band has a width determined by the bandwidth of the critical frequency band);

(d) applying the band-pass filter to the input signal to generate a band-pass filtered signal, and determining a time-averaged level (e.g., time-averaged power or energy) of the band-pass filtered signal;

(e) determining a band-cut filter, such that the band-cut filter has an attenuation band at least substantially centered at the center frequency of the critical frequency band (typically also, the attenuation band has a width determined by the bandwidth of the critical frequency band), and such that attenuation in the attenuation band is determined in response to the power threshold value such that, in response to a signal having said time-averaged level in the critical frequency band, the band-cut filter generates an attenuated signal having an attenuated time-averaged level in the critical frequency band that does not exceed the power threshold value; and (f) applying the band-cut filter to the input signal to generated a filtered signal whose frequency components in the critical frequency band are attenuated relative to the input signal's frequency components in the critical frequency band. Preferably, the frequency components of the filtered signal in the critical frequency band have a time-averaged level that does not exceed the power threshold value.

In typical embodiments in the fourth class, distortion of the speaker's output in response to the filtered signal is reduced significantly (e.g., perceptibly) relative to the distortion of the speaker's output that would otherwise occur in response to the input signal, because application of the band-cut filter attenuates frequency components of the filtered signal in the critical frequency band sufficiently to prevent them from causing the THD of sound emitted by the speaker to exceed the predetermined THD threshold value.

In typical embodiments in the fourth class, the input signal is amplified with a user-selectable gain (in response to user actuation of a volume control). Assuming that, when step (f) is not performed (so that the speaker's output is in response to the input signal rather than the filtered signal), the speaker's output in response to an input signal has a first amount of distortion when the input signal is amplified with a first gain, then typical embodiments of steps (c), (d), (e), and (f) allow average loudness (in the digital or analog domain) of the speaker's output in response to the filtered signal to be increased by amplifying the input signal with gain greater than the first gain (before performing steps (d) and (f)) without causing the speaker's output in response to the filtered signal to have distortion significantly greater than the first amount of distortion.

In typical embodiments in the fourth class, the band-cut filter determined in step (e) varies over time, in response to variation of the time-averaged level of the band-pass filtered signal over time.

The tuning parameters (e.g., center frequency and bandwidth of a critical frequency band, and power threshold value) employed in some embodiments of the invention are generated automatically by an appropriately programmed computer which has been programmed to analyze data indicative of a THD v. frequency graph for a speaker (and/or data indicative of a set of such graphs, each for an input signal having different power in the same critical frequency band of the speaker) to determine the tuning parameters. In other embodiments, the tuning parameters are determined manually by user looking at such a graph (or set of graphs). Once they have been determined for each of a set of different speakers, they could compiled as a database of tuning parameters for the speakers.

Distortion control (i.e., filtering of a speaker's input signal) in accordance with some embodiments of the invention is performed in combination with compression and/or limiting, so as to allow an increase of the average (e.g., RMS) power of the incoming input signal while preventing digital clipping (preferably with smooth limiting, and optionally with some look-ahead processing). For example, a compressor/limiter can include a distortion limiting (filtering) stage configured to perform an embodiment of the inventive filtering method, in sequence with a compressor stage and a limiter stage (typically, the limiter stage follows the compressor stage in the signal processing chain). Such a combination of distortion control, compression, and limiting can ensure sure that even quiet content (which does not utilize the digital PCM domain optimally) sounds loud and clear on a mobile phone speaker (or other speaker). For already loud content (e.g., content which utilizes the digital PCM domain optimally, such as some recently mixed pop music), the compression (or compression and limiting) should not modify the input audio significantly so as not to cause undue digital distortion.

In a class of embodiments, the invention is a loudness maximizer configured to limit distortion of the output of a speaker (e.g., a miniature speaker) by limiting distortion in a critical frequency band of the input signal being reproduced, using control parameters that have been predetermined (e.g., in a speaker measurement operation). The loudness maximizer is also configured to limit the dynamic range of the reproduced signal and to increase its perceived overall average loudness level. In various embodiments in this class, the loudness maximizer includes an embodiment of the inventive distortion control system, and also at least one of a compressor (e.g., an RMS compressor), a speaker equalization (EQ) correction module, a bass boost module, and a limiter. If present, the limiter is typically implemented as the final stage in the signal processing chain.

Some embodiments of the inventive loudness maximizer include a user volume control, a compressor (e.g., an RMS compressor), and an embodiment of the inventive distortion control system, and are operable in a "volume maximizer" mode. By operating the volume control, a user can cause the system to apply a selected gain to the input signal. When operating in the volume maximizer mode, increasing the volume setting to a setting that does not exceed a predetermined volume threshold (e.g., a setting far below maximum) activates distortion control in accordance with the invention (or allows the system to continue to perform previously activated distortion control) but disables the compressor (so that the system does not perform compression on either the input signal or the filtered signal generated in the distortion control system). When the volume setting is further increased to a setting above the threshold (e.g., to a setting not far below the maximum), the compressor is enabled (e.g., to become active to reduce dynamic range and increase RMS power of the signal) and the system continues to perform previously activated distortion control. Optionally, when the system enters the volume maximizer mode (e.g., in response to user actuation of a control) with the user volume setting at less than maximum, the system increases the volume setting to the volume threshold (or to another predetermined setting below the threshold) and activates distortion control in accordance with the invention but does not activate the compressor.

Some embodiments of the inventive loudness maximizer implement a "headroom bit allocation" feature. In these embodiments, the loudness maximizer is a digital audio system including an embodiment of the inventive distortion control system, a user-activatable loudness maximization subsystem (e.g., one or both of a compressor and a limiter), and a volume control subsystem configured to set maximum volume of an amplifier-speaker chain (i.e., maximum gain that can be applied by the system to the input signal) at a "normal" maximum value several bits below a full digital bit-width of the system when the loudness maximization subsystem is not active. In response to activation of the loudness maximization subsystem, the volume control subsystem increases the maximum volume of the amplifier-speaker chain to its full value. During operation of the loudness maximization subsystem, the distortion control subsystem (which filters the input signal to control distortion in accordance with the invention) can use the extra headroom bits so as to exceed the "normal" loudness level of the amplifier-speaker system while preventing distortion of the speaker's output and damage to the speaker.

Aspects of the invention include a system configured (e.g., programmed) to perform any embodiment of the inventive method, and a computer readable medium (e.g., a disc) which stores code for implementing any embodiment of the inventive method.

In typical embodiments, the inventive system is or includes a general or special purpose processor programmed with software (or firmware) and/or otherwise configured to perform an embodiment of the inventive method. In some embodiments, the inventive system is a general purpose processor, coupled to receive an audio input signal and an output signal indicative of the sound emitted by a speaker in response to the input signal, and programmed (with appropriate software) to generate output data indicative of tuning parameters in response to the input signal and the output signal by performing an embodiment of the inventive method. In other embodiments, the inventive system is a digital audio system including (or configured to be coupled to) at least one speaker, and including hardware configured to perform distortion control on an input signal in response to tuning parameters in accordance with the invention. In other embodiments, the inventive system is a digital audio system including (or configured to be coupled to) at least one speaker, and including software or firmware programmed or configured to perform distortion control on an input signal in response to tuning parameters in accordance with the invention.

BRIEF DESCRIPTION OF THE DRAWINGS

FIG. 1 is a block diagram of an embodiment of a system for determining tuning parameters in accordance with the invention.

FIG. 2 is a block diagram of an embodiment of a system for filtering an input signal (for reproduction by a speaker) using the tuning parameters determined in the system of FIG. 1.

FIG. 6 is a diagram of the maximum gain applicable to an input signal, by an embodiment of the inventive system implementing a headroom bit allocation feature, in a mode in which a loudness maximization subsystem is active and in a mode in which the loudness maximization subsystem is disabled.

DETAILED DESCRIPTION OF THE PREFERRED EMBODIMENTS

Many embodiments of the present invention are technologically possible. It will be apparent to those of ordinary skill in the art from the present disclosure how to implement them. Embodiments of the inventive system and method will be described with reference to FIGS. 1-8.

FIG. 1 is a block diagram of an embodiment of a system for determining tuning parameters in accordance with the invention. The FIG. 1 system includes digital audio processing system 5, and speaker 1 and microphone 3 coupled to system 5. System 5 is coupled and configured to generate an audio test signal having a desired frequency-amplitude spectrum, and to assert the test signal as an input signal to speaker 1. Microphone 3 is coupled and configured to detect the sound emitted by (the output of) speaker 1 in response to each test signal, and to assert a microphone output signal (indicative of speaker 1's output) to system 5.

Figure 3:
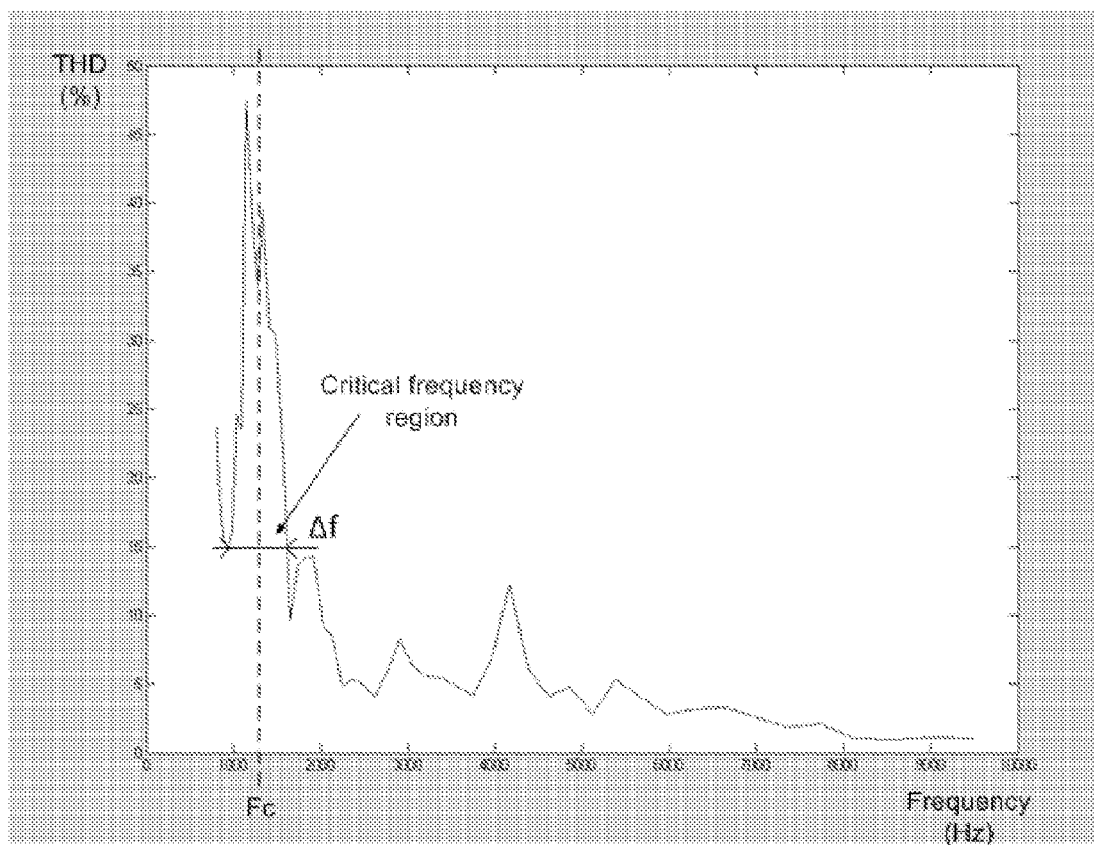
FIG. 3 is a graph of THD of the output of a speaker in response to an input signal, as a function of frequency of the input signal.

System 5 is operable to assert a sequence of test signals (having different frequencies) to speaker 1, and to process speaker 1's output (as measured by microphone 3) in response to the test signals to generate data indicative of the THD of speaker 1's output as a function of frequency. FIG. 3 is a graph of an exemplary THD curve which plots such data generated by system 5, in the case that speaker 1 is a miniature speaker driven by a sequence of test signals having frequencies in the range plotted along the horizontal axis of FIG. 3. The curve plotted in FIG. 3 indicates the THD of speaker 1's output as a function of frequency.

The FIG. 1 system also includes processor 7 which is coupled to system 5 and configured (e.g., programmed) to generate a set of tuning parameters in accordance with an embodiment of the present invention, in response to data generated by system 5 during a test of speaker 1.

Processor 7 is configured to identify at least one critical frequency band of a speaker's frequency response (in which THD peaks, in the sense that THD has a local maximum) from data generated by system 5 during such a test. For example, the data may be indicative of a THD curve (e.g., that of FIG. 3), and each critical frequency band may be a region in speaker 1's frequency response in which the THD of speaker 1's output exceeds a predetermined THD threshold value. For example, in the case that the THD threshold value is predetermined to be equal to 15%, one such critical frequency band is the range of frequencies centered at frequency "Fc" (indicated in FIG. 3), and having width "Δf" (also indicated in FIG. 3), in which the THD of speaker 1's output exceeds 15%.

In typical embodiments of the invention, distortion of a speaker's output is controlled by determining tuning parameters indicative of a critical frequency band of the speaker's frequency response and then during operation of the speaker to reproduce an input signal, performing distortion control by attenuating the input signal in the critical frequency band using the tuning parameters. The FIG. 2 system (to be described below) is configured to perform such distortion control in response to the tuning parameters generated by processor 7 of FIG. 1.

The tuning parameters employed for distortion control in accordance with the invention typically include the center frequency and bandwidth of a critical frequency band (e.g., center frequency Fc and bandwidth Δf of the critical frequency band indicated in FIG. 3, in which processor 7 has determined that the THD of speaker 1's output exceeds 15%) and a power threshold value. In some embodiments, the tuning parameters employed for a critical frequency band include a non-central frequency in the band (i.e., a frequency within the band that is not the center frequency of the band) and the band's bandwidth. The power threshold value is indicative of a minimum power (e.g. minimum average power, averaged over a time interval) of one or more frequency components in the critical frequency band (of an input signal to be reproduced by the relevant speaker) which causes the THD of sound emitted by the speaker to exceed a predetermined threshold value. Processor 7 of FIG. 1 is configured to determine a power threshold value indicative of a minimum value of the RMS power of the frequency component (of a test signal asserted to speaker 1) whose frequency is center frequency Fc of the critical frequency band, which causes the THD of sound emitted by speaker 1 to exceed the threshold value, THD=15%.

Figure 4:
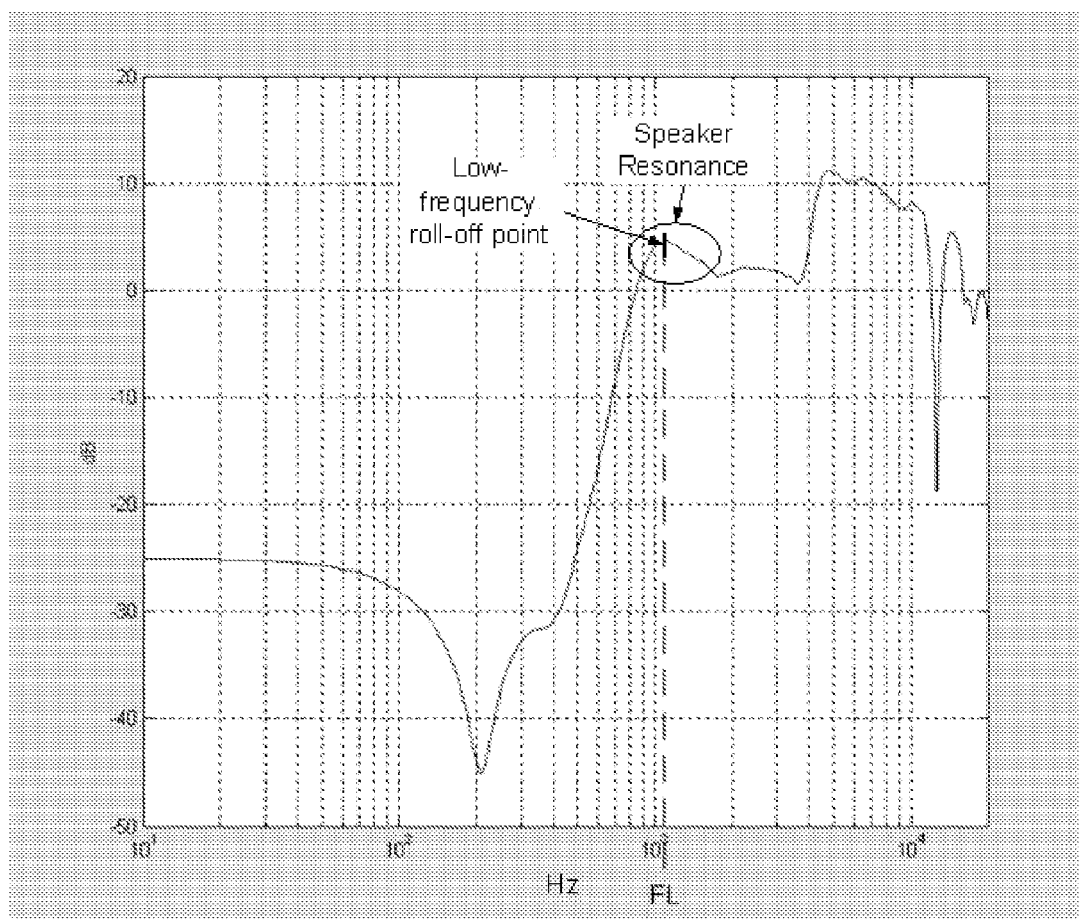
FIG. 4 is a graph of the frequency response of a miniature speaker.

The inventor has recognized that the frequency response of a mobile phone speaker (or other miniature speaker) typically has a critical frequency band (in which THD peaks) that occurs at the low-frequency roll-off point, and that the speaker typically resonates at a frequency in this critical frequency band. For example, FIG. 4 is a graph of the frequency response of such a miniature speaker, which is the same speaker whose THD curve is plotted in FIG. 3. As indicated in FIG. 4, the miniature speaker has a low-frequency roll-off point at frequency, $F_L$, which occurs at a resonance of the speaker. The frequency region in which the resonance occurs (indicated in FIG. 4) coincides with the above-described critical frequency band of FIG. 3, and low-frequency roll-off frequency ($F_L$) of FIG. 4 coincides with the center frequency (Fc) of the critical frequency band.

Thus, some embodiments of the inventive method assume that THD of a miniature speaker's output is likely to peak at the low-frequency roll-off point of the speaker's frequency response. These embodiments identify a critical frequency band in the speaker's frequency response as a band centered at the low-frequency roll-off point, and identify the center frequency and width of this band as tuning parameters (for use in controlling distortion of sound emitted by the speaker). These embodiments can determine tuning parameters for a speaker without generating a THD curve (e.g., that of FIG. 3) for the speaker (or for another speaker of the same type as the speaker). Instead, the embodiments use only the frequency response of the speaker to determine two tuning parameters (center frequency and width of an assumed critical frequency band), and can determine a third tuning parameter (the above-described power threshold value) from measurements of the THD of the speaker's output in response to a sinusoidal input signal having a sequence of different power levels, and having frequency at the center frequency of the assumed critical frequency band. For example, the FIG. 1 system can be implemented to determine such three tuning parameters in an especially computationally efficient manner, by programming processor 7 to determine the tuning parameters in response to the frequency response of speaker 1 and measurements of the THD of speaker 1's output in response to a sinusoidal input signal having a sequence of power levels and a frequency at the center frequency of the assumed critical frequency band, without the need for system 5 to generate a THD curve (e.g., that of FIG. 3) for the speaker.

The FIG. 1 system is operable to perform embodiments of the inventive method for determining tuning parameters for use in attenuating frequency components (in a critical frequency band) of an input signal to control distortion of a speaker's output in response to the input signal, said method including steps of:

(a) identifying at least one critical frequency band of the speaker's frequency response in which THD peaks (i.e., processor 7 of FIG. 1 is configured to identify, from test data generated by system 5, each critical frequency band of speaker 1's frequency response in which THD exceeds a predetermined threshold, or in which THD otherwise peaks in the sense that THD has a local maximum);

(b) determining a center frequency of the critical frequency band and a bandwidth of the critical frequency band (processor 7 is configured to determine the center frequency and bandwidth of each critical frequency band that it identifies);

(c) determining a power threshold value indicative of a minimum power of at least one frequency component in the critical frequency band, of an input signal, which causes the THD of sound emitted by the speaker in response to the input signal to exceed a predetermined THD threshold value (processor 7 is configured to determine such a power threshold value in response to test data from system 5), wherein the tuning parameters include the center frequency of the critical frequency band, the bandwidth of the critical frequency band, and the power threshold value.

In some embodiments in this class, system 5 determines a THD curve indicative of THD of speaker 1's output as a function of frequency and processor 7 identifies, as the critical frequency band, a frequency range of the THD curve in which THD exceeds a predetermined second THD threshold value. In some embodiments, the second THD threshold value is THD=x %, (e.g., x is equal to 10 or 15, or x is a value in the range from 10 to 15). In some embodiments, the THD threshold value (recited in step (c)) is equal to this second THD threshold value. In various embodiments in this class, processor 7 identifies a critical frequency band of the speaker's frequency response to be a band in which measured THD exceeds a predetermined second THD threshold value, or in which measured THD peaks, or in which a quantity indicative of THD peaks or has a local minimum or maximum, where peaking of THD in this context denotes that THD has a local maximum.

In some embodiments in this class, processor 7 determines the power threshold value for the relevant critical frequency band to be indicative of the minimum average power (averaged over a time interval) of the at least one frequency component in the critical frequency band which causes the THD of sound emitted by speaker 1 to exceed the THD threshold value. In some such embodiments, processor 7 determines the power threshold value to be a minimum value of the RMS power of a frequency component of the test signal in the relevant critical frequency band (e.g., a frequency component having frequency equal to the center frequency of the critical frequency band) which causes the THD of sound emitted by speaker 1 to exceed the THD threshold value.

The FIG. 2 system is a typical embodiment of the inventive distortion control system, which is configured to limit distortion of sound emitted by a speaker by applying a band-cut filter (in filter stage 17 of FIG. 2) to an input signal asserted to the speaker. The band-cut filter's parameters are determined in response to tuning parameters (e.g., those generated by the FIG. 1 system as described above) such that the band-cut filter attenuates the input signal's energy in a critical frequency band so as to reduce distortion of the speaker's output (which is expected to occur predominantly and/or most perceptibly in the critical frequency band). This in turn allows frequency components of the input signal outside the critical frequency band to be further amplified (e.g., by compressor 25 of the FIG. 5 system described below, in which system distortion control stage 29 is implemented as shown in FIG. 2) to increase the perceived loudness of the speaker's output without significantly increased distortion. The filter applied by stage 17 of FIG. 2 is dynamic in the FIG. 2 embodiment, but can alternatively by implemented as a fixed filter in a variation on the FIG. 2 embodiment. By employing a time-varying band-cut filter of appropriate bandwidth and appropriate rate of change, audible artifacts caused by filtering in accordance with the invention (such as tonality changes of the input signal) are acceptably small (e.g., imperceptible).

In some embodiments, an input signal to a speaker is attenuated in each of two or more critical frequency bands. For example, system 5 of FIG. 1 identifies two or more critical frequency bands, processor 7 generates a set of tuning parameters for each critical frequency band, and a copy of the FIG. 2 system is provided for each critical frequency band, so that each copy of the FIG. 2 system applies a band-cut filter (centered at a different one of the critical frequency bands) to the input signal in response to a different one of the tuning parameter sets.

In some embodiments, the input signal of each speaker of a multi-speaker system is attenuated in accordance with the invention (e.g., each channel of a multi-channel sound system is band-cut filtered by a copy of the FIG. 2 system, to control distortion). If more than one speaker (e.g., each for reproducing a different audio channel) is included in an audio system, a measurement procedure can be performed individually for each of the speakers to determine a set of tuning parameters for each such speaker (in accordance with some embodiments of the invention). Preferably, the input signal for each speaker is then filtered (during operation of the system to reproduce all the input signals) using the tuning parameters determined in the corresponding measurement procedure.

The distortion control system of FIG. 2 includes band-pass filter stage 11, and band-cut filter stage 17, each coupled to filter an input signal for a speaker. The speaker is not shown in FIG. 2, but in typical operation the filtered signal output from filter stage 17 is asserted directly to the speaker. Level determining element 13 is coupled to receive the band-pass filtered signal output from filter stage 11, and configured to determine a time-averaged level (e.g., time-averaged power or energy) of the band-pass filtered signal.

Band-cut filter selection element 15 is coupled to receive the current time-averaged level from element 13, and configured to assert a band-cut filter selection signal to filter stage 17 in response thereto. In typical embodiments filter stage 17 is configured to apply (to the input signal) a band-cut filter having an attenuation band with a selectable center frequency, a selectable width, and a selectable attenuation. Band-cut filter selection element 15 is configured to generate the band-cut filter selection signal in response to a power threshold value tuning parameter of the type described above, and the current time-averaged level from element 13, in a manner to be described below. The band-cut filter selection signal determines (selects) the attenuation applied in the band-cut filter's attenuation band. The center frequency and width of the attenuation band are determined (selected) by tuning parameters (of the type described above) indicative of the center frequency and width of a critical frequency band.

Figure 7:
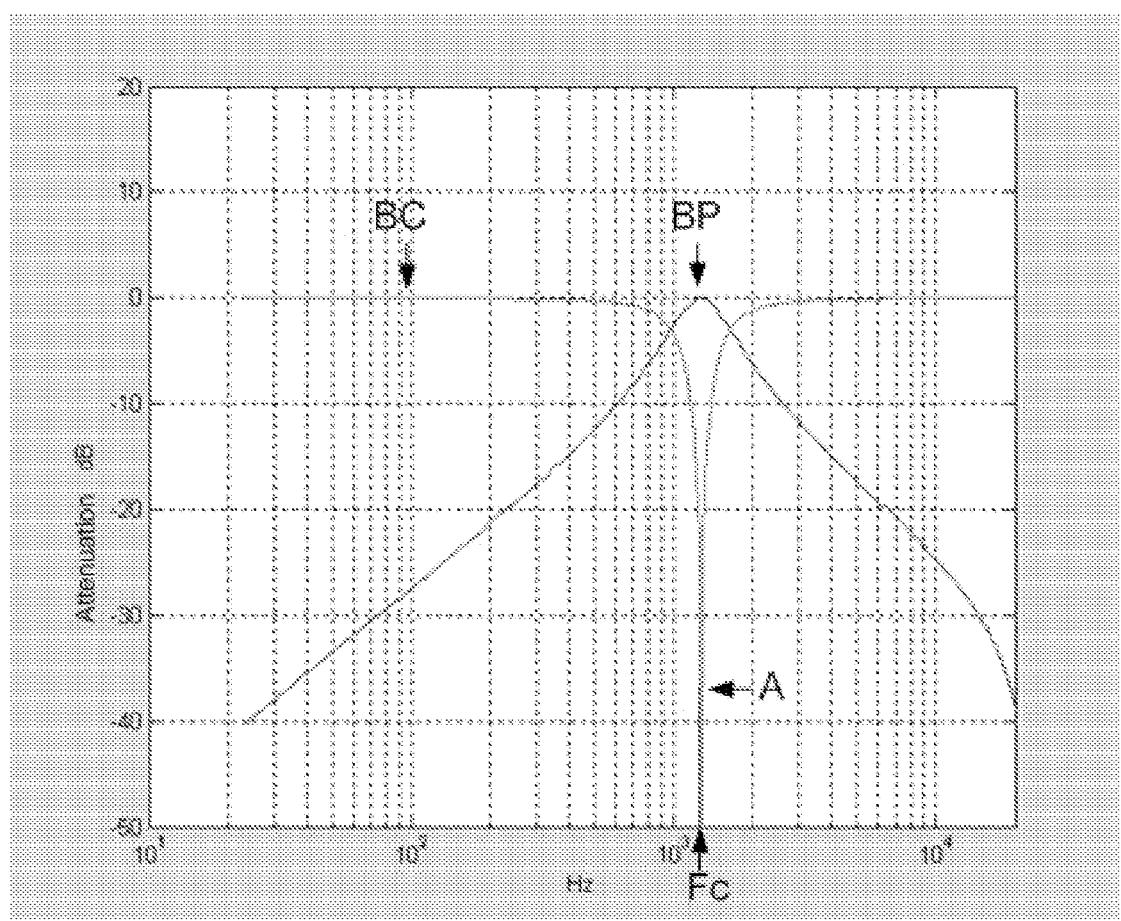
FIG. 7 is a graph of gain (as a function of frequency) applied by an exemplary band-pass filter determined in stage 11 of FIG. 2, and by an exemplary band-cut filter determined in stage 17 of FIG. 2.

Curve BC of FIG. 7 is an example of the attenuation as a function of frequency that may be applied (in stage 17) by the selected band-cut filter. The attenuation band determined by curve BC has center frequency Fc which is selected in response to a first tuning parameter (asserted to stage 17) to match the center frequency Fc of a critical frequency band of the speaker's frequency response, and a width which is selected in response to a second tuning parameter (also asserted to stage 17) to match the width of the critical frequency band. The maximum attenuation (indicated by attenuation value "A" of curve BC in FIG. 7) is determined by the band-cut filter selection signal from element 15, which is in turn determined (in part) by a third tuning parameter (which is a power threshold value). Filter selection element 15 is configured to generate the band-cut filter selection signal in response to this power threshold value (the third tuning parameter) and the current time-averaged level of the band-pass filtered input signal from element 13, so as to cause the maximum attenuation of the selected band-cut filter (which is applied by stage 17) to be sufficient that the band-cut filtered signal (output from stage 17) has an attenuated time-averaged level in the critical frequency band that does not exceed the power threshold value. In typical operation of the FIG. 2 system, the parameters of the band-cut filter applied by stage 17 vary over time in response to variation over time of the time-averaged level of the band-pass filtered signal asserted to element 15 from element 13.

Curve BP of FIG. 7 is an example of the attenuation as a function of frequency that may be applied (in stage 11 of FIG. 2) to the input signal by a band-pass filter whose parameters are determined by tuning parameters (predetermined by the FIG. 1 system). The pass band determined by curve BP has center frequency Fc which is selected in response to the above-mentioned first tuning parameter (asserted to filter stage 11 and also to stage 17) to match the center frequency Fc of a critical frequency band of the speaker's frequency response, and a width which is selected in response to the above-mentioned second tuning parameter (also asserted to filter stage 11 as well as to stage 17) to match the width of the critical frequency band.

In typical implementations, element 13 of FIG. 2, measures a level of the band-pass filtered signal output from filter stage 11 (e.g., level of at least one frequency component of the band-pass filtered signal in the critical frequency band) on a time frame basis to determine the time-averaged level (e.g., determining a running average of power or energy of the band-pass filtered signal over a frame of predetermined duration). In some embodiments, the frame may have a duration of 20 ms, for example. Preferably, element 13 is operable to measure level of the band-pass filtered signal on a time frame basis to determine a raw, time-averaged level, and smooths the raw, time-averaged level with predetermined attack and release time constants to determine the time-averaged level.

Figure 8:
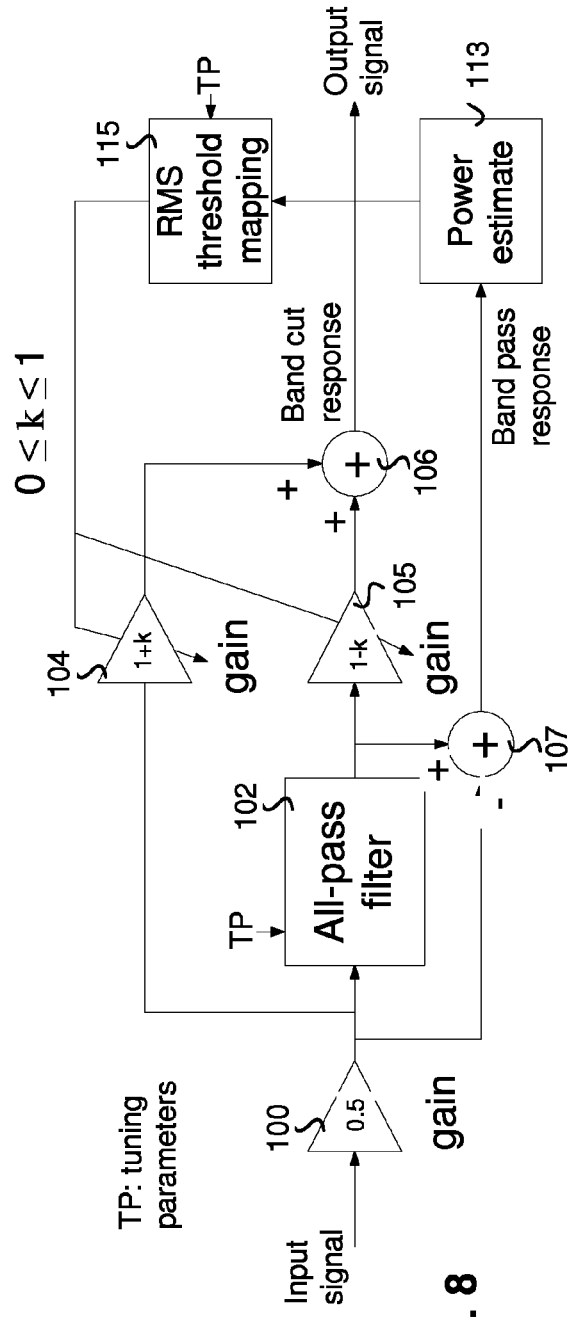
FIG. 8 is a block diagram of another embodiment of a system for filtering an input signal using tuning parameters determined in the system of FIG. 1, including an all-pass filter which is employed to implement both a band-pass filter and a band-cut filter.

FIG. 8 is a block diagram of another embodiment of the inventive system for filtering an input signal (for driving a speaker) using tuning parameters (e.g., tuning parameters determined in the system of FIG. 1). The FIG. 8 system is an alternative embodiment of the FIG. 2 system having a particularly efficient implementation, in which a single all-pass filter 102 is employed to implement both a band-pass filter and a band-cut filter.

The distortion control system of FIG. 8 includes initial amplification stage 100. Stage 100 is an amplifier operable to apply a user-selectable gain to the input signal in response to user actuation of a volume control (not shown in FIG. 8). If one assumes that the output of stage 100 were used to drive the speaker directly, and the speaker's output in response to stage 100's output has a first amount of distortion when stage 100 applies a first gain to the input signal, then with this assumption, filtering the input signal using the entire FIG. 8 system (including its elements other than stage 100) allows average loudness (in the digital or analog domain) of the speaker's output in response to the band-cut filtered signal (output from element 106) to be increased by amplifying the input signal in stage 100 with gain greater than the first gain, without causing the speaker's output in response to the filtered signal to have distortion significantly greater than the first amount of distortion.

The FIG. 8 system includes all-pass filter 102. Filter 102 is coupled and configured to apply a 180 degree phase shift to the output of stage 100, centered on a critical frequency band (of the speaker's frequency response) as determined by tuning parameters asserted to filter 102, and to apply less phase shift to frequency components of the stage 100's output outside this critical frequency band. Filter 102 may be implemented as a biquadratic filter. The tuning parameters may have been generated by the FIG. 1 system. Amplifier 104 is coupled and configured to amplify the output of stage 100 by gain 1+k, and amplifier 105 is coupled and configured to amplify the output of filter 102 by gain 1−k, where k is a control parameter that is asserted to amplifiers 104 and 105 from element 115.

Addition element 106 is coupled and configured to add the output of amplifier 104 to the output of amplifier 105. Thus, filter 102 and elements 104, 105, and 106 together implement a band-cut filter whose output is a band-cut filtered signal similar (or identical) to the output of band-cut filter 17 of FIG. 2, and whose attenuation band is centered at the center of the critical frequency band determined by the tuning parameters asserted to filter 102.

Subtraction element 107 is coupled and configured to subtract the output of stage 100 from the output of filter 102. Thus, filter 102 and element 107 together implement a band-pass filter whose output is a band-pass filtered signal similar (or identical) to the output of band-pass filter 11 of FIG. 2, and whose pass band is centered at the center of the critical frequency band determined by the tuning parameters asserted to filter 102.

Level determining element 113 is coupled to receive the band-pass filtered signal output from the system's band-pass filter stage (i.e., the output of element 107), and configured to determine a time-averaged level (e.g., time-averaged power or energy) of the band-pass filtered signal.

Band-cut filter selection element 115 is coupled to receive the current time-averaged level from element 113, and configured to assert the control parameter k (which is a band-cut filter selection signal, having value in the range $0 \leq k \leq 1$) to amplifiers 104 and 105 in response to this time-averaged level. In typical embodiments, the band-cut filter (implemented by elements 102, 104, 105, and 106) is configured to apply (to the amplified input signal asserted at stage 100's output) a band-cut filter having an attenuation band with a selectable center frequency, a selectable width, and a selectable attenuation. Band-cut filter selection element 115 is configured to generate control parameter k (the band-cut filter selection signal) in response to both a power threshold value tuning parameter (of the type described above) asserted to element 115, and the current time-averaged level from element 113, in a manner similar or identical to the above-described manner in which element 15 of FIG. 2 generates a band-cut filter selection signal. The band-cut filter selection signal determines the attenuation applied in the band-cut filter's attenuation band. In response to the control parameter value k=0, the band-cut filter is a maximal attenuation notch filter. In response to the control parameter value k=1, the band-cut filter is an all-pass filter. The center frequency and width of the attenuation band are determined by tuning parameters asserted to filter 102 that are indicative of the center frequency and width of a critical frequency band of the speaker's frequency response.

In typical operation of the FIG. 8 system, the parameters of the band-cut filter (applied by elements 102, 104, 105, and 106) vary over time in response to variation over time of the time-averaged level of the band-pass filtered signal asserted to element 115 from element 113.

The FIG. 2 (or FIG. 8) system is operable to perform embodiments of the inventive method for filtering an input signal for a speaker using tuning parameters, to control distortion of the speaker's output, where the tuning parameters include a center frequency and a bandwidth of a critical frequency band of the speaker's frequency response in which THD peaks, and the tuning parameters also include a power threshold value indicative of a minimum power of at least one frequency component, in the critical frequency band, of an input signal to the speaker, which causes the THD of sound emitted by the speaker in response to the input signal to exceed a predetermined THD threshold value. In such embodiments, the method includes steps of:

(a) determining a band-pass filter, such that the band-pass filter has a pass band that is at least substantially centered at the center frequency of the critical frequency band, and the pass band has a width determined by the bandwidth of the critical frequency band (i.e., filter stage 11 of FIG. 2 is operable to so determine a band-pass filter);

(b) applying the band-pass filter to the input signal to generate a band-pass filtered signal, and determining a time-averaged level (e.g., time-averaged power or energy) of the band-pass filtered signal (i.e., filter stage 11 of FIG. 2 is operable to apply the determined band-pass filter, and level determining element 13 is operable to determine such a time-averaged level);

(c) determining a band-cut filter, such that the band-cut filter has an attenuation band at least substantially centered at the center frequency of the critical frequency band, the attenuation band has a width determined by the bandwidth of the critical frequency band, and such that attenuation in the attenuation band is determined in response to the power threshold value such that, in response to a signal having said time-averaged level in the critical frequency band, the band-cut filter generates an attenuated signal having an attenuated time-averaged level in the critical frequency band that does not exceed the power threshold value (i.e., band-cut filter selection element 15 and filter stage 17 of FIG. 2 are operable as described above to so determine a band-cut filter to be applied by stage 17); and (d) applying the band-cut filter to the input signal to generate a filtered signal whose frequency components in the critical frequency band are attenuated relative to the input signal's frequency components in the critical frequency band (i.e., filter stage 17 of FIG. 2 is operable as described above to apply such a band-cut filter to the input signal to generate such a filtered signal, preferably such that the frequency components of the filtered signal in the critical frequency band have a time-averaged level that does not exceed the power threshold value).

In some such embodiments, distortion of the speaker's output in response to the filtered signal (output from filter stage 17) is reduced significantly (e.g., perceptibly) relative to the distortion of the speaker's output that would otherwise occur in response to the input signal, because application of the band-cut filter attenuates frequency components of the filtered signal in the critical frequency band sufficiently to prevent them from causing the THD of sound emitted by the speaker to exceed the predetermined THD threshold value.

In some implementations of FIG. 2, the input signal asserted to stages 11 and 17 has been amplified with a user-selectable gain (in response to user actuation of a volume control, not shown in FIG. 2). Assuming that, when step (d) is not performed (so that the speaker's output is in response to the input signal input to stage 17 rather than the filtered signal output from stage 17), the speaker's output in response to an input signal has a first amount of distortion when the input signal is amplified with a first gain, then typical embodiments of steps (a), (b), (c), and (d) allow average loudness (in the digital or analog domain) of the speaker's output in response to the filtered signal (output from stage 17) to be increased by amplifying the input signal with gain greater than the first gain (before performing steps (b) and (d)) without causing the speaker's output in response to the filtered signal to have distortion significantly greater than the first amount of distortion.

The systems of FIGS. 1 and 2 (or FIGS. 1 and 8) are operable to perform a class of embodiments of the inventive method for filtering an input signal (the input signal asserted to stages 11 and 17 of FIG. 2, or to stage 100 of FIG. 8) for a speaker to control distortion of the speaker's output. In such embodiments, the method includes steps of:

(a) identifying (in processor 7 of FIG. 1) at least one critical frequency band of the speaker's frequency response, in which total harmonic distortion (THD) peaks, and determining (also in processor 7) a center frequency of the critical frequency band and a bandwidth of the critical frequency band;

(b) determining (in processor 7) a power threshold value indicative of a minimum power of at least one frequency component in the critical frequency band, of an input signal, which causes the THD of sound emitted by the speaker in response to the input signal to exceed a predetermined THD threshold value;

(c) determining (e.g., in stage 11 of FIG. 2) a band-pass filter, such that the band-pass filter has a pass band that is at least substantially centered at the center frequency of the critical frequency band (typically also, the pass band has a width determined by the bandwidth of the critical frequency band);

(d) applying the band-pass filter (e.g., in stage 11) to the input signal to generate a band-pass filtered signal, and determining (in element 13) a time-averaged level (e.g., time-averaged power or energy) of the band-pass filtered signal;

(e) determining (e.g., in element 15 and stage 17 of FIG. 2) a band-cut filter, such that the band-cut filter has an attenuation band at least substantially centered at the center frequency of the critical frequency band (typically also, the attenuation band has a width determined by the bandwidth of the critical frequency band), and such that attenuation in the attenuation band is determined in response to the power threshold value such that, in response to a signal having said time-averaged level in the critical frequency band, the band-cut filter generates an attenuated signal having an attenuated time-averaged level in the critical frequency band that does not exceed the power threshold value; and (f) applying (e.g., in stage 17) the band-cut filter to the input signal to generated a filtered signal whose frequency components in the critical frequency band are attenuated relative to the input signal's frequency components in the critical frequency band. Preferably, the frequency components of the filtered signal in the critical frequency band have a time-averaged level that does not exceed the power threshold value.

In typical embodiments in this class, distortion of the speaker's output in response to the filtered signal (e.g., output from filter stage 17) is reduced significantly (e.g., perceptibly) relative to the distortion of the speaker's output that would otherwise occur in response to the input signal, because application of the band-cut filter attenuates frequency components of the filtered signal in the critical frequency band sufficiently to prevent them from causing the THD of sound emitted by the speaker to exceed the predetermined THD threshold value.

As noted above, in some implementations of FIG. 2 the input signal asserted to stages 11 and 17 has been amplified with a user-selectable gain (in response to user actuation of a volume control, not shown in FIG. 2). Assuming that, when step (f) is not performed (so that the speaker's output is in response to the input signal rather than the filtered signal), the speaker's output in response to an input signal has a first amount of distortion when the input signal is amplified with a first gain, then typical embodiments of steps (c), (d), (e), and (f) allow average loudness (in the digital or analog domain) of the speaker's output in response to the filtered signal to be increased by amplifying the input signal with gain greater than the first gain (before performing steps (d) and (f)) without causing the speaker's output in response to the filtered signal to have distortion significantly greater than the first amount of distortion.

The tuning parameters (e.g., center frequency and bandwidth of a critical frequency band, and power threshold value) employed in some embodiments of the invention are generated automatically by an appropriately programmed computer (e.g., processor 7 of FIG. 1, implemented in such a computer) which has been programmed to analyze data indicative of a THD v. frequency graph for a speaker (and/or data indicative of a set of such graphs, each for an input signal having different power in the same critical frequency band of the speaker) to determine the tuning parameters. In other embodiments, the tuning parameters are determined manually by user looking at such a graph (or set of graphs). Once they have been determined for each of a set of different speakers, they could compiled as a database of tuning parameters for the speakers.

Figure 5:
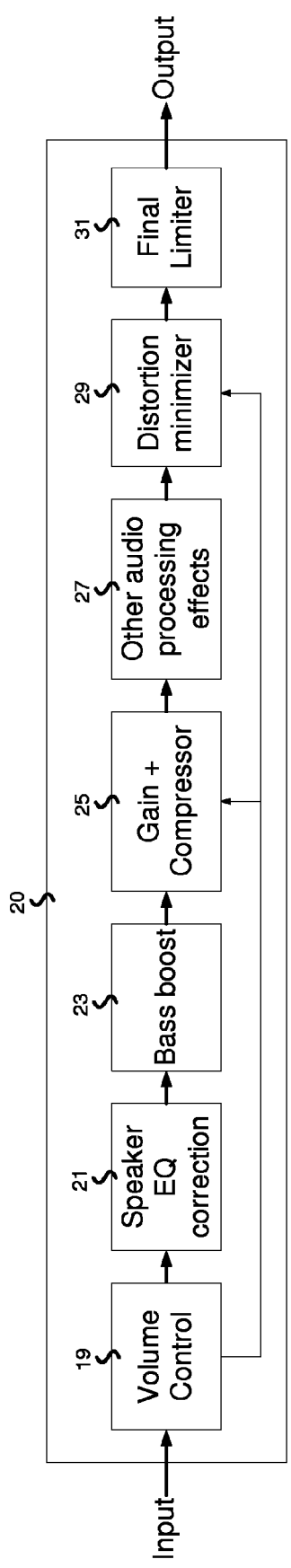
FIG. 5 is a block diagram of an embodiment of a loudness maximizer including a distortion control stage implemented in accordance with an embodiment of the invention.

Next, with reference to FIGS. 5 and 6, we describe embodiments in which distortion control (i.e., filtering of a speaker's input signal) is performed in combination with compression and/or limiting so as to allow an increase in the average (e.g., RMS) power of the incoming input signal while preventing digital clipping (preferably with smooth limiting, and optionally with some look-ahead processing). For example, a compressor/limiter can include a distortion limiting (filtering) stage configured to perform an embodiment of the inventive filtering method, in sequence with a compressor stage and a limiter stage (typically, the limiter stage follows the compressor stage in the signal processing chain). Such a combination of distortion control, compression, and limiting can ensure sure that even quiet content (which does not utilize the digital PCM domain optimally) sounds loud and clear on a mobile phone speaker (or other speaker). For already loud content (e.g., content which utilizes the digital PCM domain optimally, such as some recently mixed pop music), the compression (or compression and limiting) should not modify the input audio significantly so as not to cause undue digital distortion.

In a class of embodiments, the invention is a loudness maximizer configured to limit distortion of the output of a speaker (e.g., a miniature speaker) by limiting distortion in a critical frequency band (of the audio signal being reproduced) using control parameters that have been predetermined in a speaker measurement operation. In various embodiments in this class, the loudness maximizer includes an embodiment of the inventive distortion control system, and also at least one of a compressor (e.g., an RMS compressor), a speaker equalization (EQ) correction module, a bass boost module, and a limiter. If present, the limiter is typically implemented as the final stage in the signal processing chain.

FIG. 5 is a block diagram of a loudness maximizer (20) including a signal processing chain including a distortion control stage 29 which implements an embodiment of the inventive distortion reduction system. For example, stage 29 can be implemented to be identical to the above-described FIG. 2 system. Other processing stages of loudness maximizer 20 are volume control 19, speaker EQ correction module 21 (coupled and configured to receive and process the output of control 19), bass boost module 23 (coupled and configured to receive and process the output of module 21), RMS compressor 25 (coupled and configured to receive and process the output of module 23), audio processing module 27 (coupled and configured to receive and process the output of compressor 25), and limiter stage 31 (coupled and configured to receive and process the output of stage 29). Distortion control stage 29 is coupled and configured to receive and process the output of module 27 in accordance with the invention. Limiter stage 31 is preferably configured to perform peak limiting on the filtered signal output from stage 29, including by identifying peaks in the filtered signal and attenuating said filtered signal at (or around) each peak, preferably in a manner that prevents clipping.

The use of the inventive distortion reduction system (e.g., system 29) with a speaker EQ correction module (e.g., module 21) further reduces distortions because peaking regions of the frequency response typically correlate with high amounts of THD. By attenuating these peaking frequency regions in the EQ correction module (e.g., module 21), THD is also reduced in the peaking frequency regions.

The use of the inventive distortion reduction system (e.g., system 29) with a bass boost module (e.g., module 23) increases perceived loudness and for much content produces a more pleasant, fuller sound.

Audio processing module 27 of FIG. 5 can implement any of a variety of audio processing effects, but these effects should be implemented so as not to undo the effect of the distortion reduction performed by stage 29. Optionally, module 27 is omitted, and the output of compressor 25 is asserted directly to the input of system 29.

Loudness maximizer 20 of FIG. 5 also includes user volume control 19. Volume control 19 is a volume control stage of maximizer 20 which is coupled and configured to apply a selected gain to the input signal in response to user selection of a volume setting. Compressor 25 is a compression stage of maximizer 20.

Loudness maximizer 20 is operable in a "volume maximizer" mode, and is configured to operate as follows in the volume maximizer mode:

operation of control 19 to increase the volume setting to a setting that does not exceed a predetermined volume threshold disables compression stage 25, thereby preventing the compression stage from performing dynamic range compression, but does not disable distortion control stage 29, and a further increase of the volume setting to a setting that exceeds the volume threshold enables compression stage 25 (and does not disable distortion control stage 29).

More specifically, when system 20 operates in the volume maximizer mode, operating the control 19 to increase the volume setting to a setting that does not exceed the predetermined volume threshold (e.g., a setting far below maximum) activates system 29 to cause system 20 to perform distortion control in accordance with the invention (or if system 29 has previously been activated, allows system 29 to continue to perform distortion control) but disables compressor 25 (so that system 20 does not perform compression on the input signal). When system 20 operates in the volume maximizer mode, again operating the control 19 to further increase the volume setting to a setting above the volume threshold (e.g., to a setting not far below the maximum) causes compressor 25 to become active (e.g., to reduce dynamic range and increase RMS power of the input signal) and allows system 29 to continue to perform distortion control. Optionally, when system 20 enters the volume maximizer mode (e.g., in response to user actuation of a mode entry control, not shown in FIG. 5) with the user volume setting (determined by control 19) at less than maximum, system 20 increases the volume setting to the volume threshold (or to another predetermined setting below the volume threshold) and activates distortion control by system 29 in accordance with the invention but does not activate compressor 25.

Some embodiments of the inventive loudness maximizer (e.g., some implementations of loudness maximizer 20) implement a "headroom bit allocation" feature. In these embodiments, the inventive system is a digital audio system including an embodiment of the inventive distortion control system (e.g., system 29 of maximizer), a user-activatable loudness maximization subsystem (e.g., compressor 25 and limiter 31 of maximizer 20), and a volume control subsystem (e.g., volume control 19 of maximizer 20). The volume control subsystem is coupled and configured to apply a selected gain to the input signal in response to user selection of a volume setting, and is operable to apply no more than a first maximum gain to the input signal when the loudness maximization subsystem is not active, but is operable in response to activation of the loudness maximization subsystem to apply gain in a range up to a second maximum gain to the input signal, where the second maximum gain is greater than the first maximum gain. For example, in some such embodiments the loudness maximizer (e.g., loudness maximizer 20) includes a volume control subsystem (e.g., volume control 19 of maximizer 20) configured to set maximum volume of the amplifier-speaker chain (i.e., maximum gain that can be applied by loudness maximizer 20 to the input signal) at a "normal" maximum value several bits below a full digital bit-width of the system (e.g., the maximum volume available with the n-m bits of the "reduced digital full-scale" range shown in FIG. 6, where m is an integer, and n is an integer greater than m) when the loudness maximization subsystem is not active. In response to activation of the loudness maximization subsystem, the volume control subsystem increases the maximum volume of the amplifier-speaker chain to its full value (e.g., the maximum volume available with the full n bits of the "absolute digital full-scale" range shown in FIG. 6). During operation of the loudness maximization subsystem, the distortion control subsystem (e.g., system 29 of loudness maximizer 20), which filters the input signal to control distortion in accordance with the invention, can use the extra headroom bits (e.g., the m additional bits of the absolute digital full-scale of FIG. 6) so as to exceed the "normal" loudness level of the amplifier-speaker system while preventing distortion of the speaker's output and damage to the speaker.

Aspects of the invention include a system configured (e.g., programmed) to perform any embodiment of the inventive method, and a computer readable medium (e.g., a disc) which stores code for implementing any embodiment of the inventive method.

In typical embodiments, the inventive system is or includes a general or special purpose processor programmed with software (or firmware) and/or otherwise configured to perform an embodiment of the inventive method. In some embodiments, the inventive system is a general purpose processor (e.g., a processor implementing elements 5 and 7 of FIG. 1), coupled and configured to generate an audio input signal (e.g., the test signal of FIG. 1) and an output signal (e.g., the output of microphone 3 of FIG. 1) indicative of the output of a speaker in response to the input signal, and programmed (with appropriate software) to generate output data indicative of tuning parameters in response to the output signal by performing an embodiment of the inventive method. In other embodiments, the inventive system is a digital audio system including (or configured to be coupled to) at least one speaker, and including hardware configured to perform distortion control on an input signal in response to tuning parameters in accordance with the invention. In other embodiments, the inventive system is a digital audio system including (or configured to be coupled to) at least one speaker, and including software or firmware programmed or configured to perform distortion control on an input signal in response to tuning parameters in accordance with the invention.

While specific embodiments of the present invention and applications of the invention have been described herein, it will be apparent to those of ordinary skill in the art that many variations on the embodiments and applications described herein are possible without departing from the scope of the invention described and claimed herein. It should be understood that while certain forms of the invention have been shown and described, the invention is not to be limited to the specific embodiments described and shown or the specific methods described.

What is claimed is:

1. A method for determining tuning parameters for use in attenuating frequency components in a critical frequency band of an input signal, to control distortion of a speaker's output in response to the input signal, said method including steps of:
    (a) identifying at least one critical frequency band of the speaker's frequency response, in which total harmonic distortion (THD) peaks;
    (b) determining a center frequency of the critical frequency band and a bandwidth of the critical frequency band;
    (c) determining a power threshold value indicative of a minimum power of at least one frequency component in the critical frequency band, of an input signal, which causes the THD of sound emitted by the speaker in response to the input signal to exceed a predetermined THD threshold value, wherein the tuning parameters include the center frequency of the critical frequency band, the bandwidth of the critical frequency band, and the power threshold value.

2. The method of claim 1, wherein step (a) includes a step of determining a THD curve indicative of THD of output of the speaker as a function of frequency, and identifying as the critical frequency band a frequency range of the THD curve in which THD exceeds a predetermined second THD threshold value.

3. A method for filtering an input signal for a speaker using tuning parameters to control distortion of the speaker's output, where the tuning parameters include a center frequency and a bandwidth of a critical frequency band of the speaker's frequency response in which total harmonic distortion (THD) peaks, and the tuning parameters also include a power threshold value indicative of a minimum power of at least one frequency component, in the critical frequency band, of an input signal to the speaker, which causes the THD of sound emitted by the speaker in response to the input signal to exceed a predetermined THD threshold value, said method including steps of:
    (a) determining a band-pass filter, such that the band-pass filter has a pass band that is at least substantially centered at the center frequency of the critical frequency band;
    (b) applying the band-pass filter to the input signal to generate a band-pass filtered signal, and determining a time-averaged level of the band-pass filtered signal;
    (c) determining a band-cut filter, such that the band-cut filter has an attenuation band at least substantially centered at the center frequency of the critical frequency band, and such that attenuation in the attenuation band is determined in response to the power threshold value such that, in response to a signal having said time-averaged level in the critical frequency band, the band-cut filter generates an attenuated signal having an attenuated time-averaged level in the critical frequency band that does not exceed the power threshold value; and
    (d) applying the band-cut filter to the input signal to generate a filtered signal whose frequency components in the critical frequency band are attenuated relative to the input signal's frequency components in the critical frequency band.

4. The method of claim 3, wherein the frequency components of the filtered signal in the critical frequency band have a time-averaged level that does not exceed the power threshold value.

5. The method of claim 3, wherein the pass band has a width determined by the bandwidth of the critical frequency band, and the attenuation band has a width determined by the bandwidth of the critical frequency band.

6. The method of claim 3, wherein the band-cut filter determined in step (c) varies over time, in response to variation of the time-averaged level of the band-pass filtered signal over time.

7. The method of claim 3, wherein step (b) includes a step of measuring level of the band-pass filtered signal on a time frame basis to determine said time-averaged level.

8. The method of claim 7, wherein step (b) includes a step of measuring level of the band-pass filtered signal on a time frame basis to determine said time-averaged level, including by determining a running average of one of power and energy of the band-pass filtered signal over a frame of predetermined duration.

9. The method of claim 3, wherein step (b) includes steps of measuring level of the band-pass filtered signal on a time frame basis to determine a raw, time-averaged level, and smoothing the raw, time-averaged level with predetermined attack and release time constants to determine said time-averaged level.

10. The method of claim 3, also including a step of performing at least one of peak limiting and dynamic range compression on at least one of the input signal and the filtered signal, so as to allow an increase in average power of the input signal while preventing digital clipping of the speaker's output.

11. The method of claim 3, also including the steps of:
    applying a selected gain to the input signal in response to user selection of a volume setting; and
    in response to an increase of the volume setting to a setting that exceeds a predetermined volume threshold, performing dynamic range compression on at least one of the input signal and the filtered signal while continuing to perform steps (a), (b), (c), and (d).

12. A system configured to determine tuning parameters for use in attenuating frequency components in a critical frequency band of an input signal to control distortion of a speaker's output in response to the input signal, said system including:
    a digital audio processing subsystem configured to assert a test input signal to the speaker, and to process audio output of the speaker in response to the test input signal including by determining the speaker's frequency response; and
    a second processing subsystem configured to identify at least one critical frequency band of the speaker's frequency response in which total harmonic distortion (THD) peaks, to determine a center frequency of the critical frequency band and a bandwidth of the critical frequency band, and to determine a power threshold value indicative of a minimum power of at least one frequency component in the critical frequency band, of an input signal, which causes the THD of sound emitted by the speaker in response to the input signal to exceed a predetermined THD threshold value, wherein the tuning parameters include the center frequency of the critical frequency band, the bandwidth of the critical frequency band, and the power threshold value.

13. A system for filtering an input signal for a speaker using tuning parameters to control distortion of the speaker's output, where the tuning parameters include a center frequency and a bandwidth of a critical frequency band of the speaker's frequency response in which total harmonic distortion (THD) peaks, and the tuning parameters also include a power threshold value indicative of a minimum power of at least one frequency component, in the critical frequency band, of an input signal to the speaker, which causes the THD of sound emitted by the speaker in response to the input signal to exceed a predetermined THD threshold value, said system including:
- a band-pass filter stage, coupled and configured to apply a band-pass filter to the input signal to generate a band-pass filtered signal, and, wherein the band-pass filter has a pass band that is at least substantially centered at the center frequency of the critical frequency band;
- a level determining stage, coupled to the band-pass filter stage and configured to determine a time-averaged level of the band-pass filtered signal; and
- a band-cut filter stage, coupled to the level determining stage and configured to apply a band-cut filter to the input signal to generate a filtered signal whose frequency components in the critical frequency band are attenuated relative to the input signal's frequency components in the critical frequency band, wherein the band-cut filter has an attenuation band at least substantially centered at the center frequency of the critical frequency band, and attenuation in the attenuation band is determined in response to the power threshold value such that, in response to a signal having said time-averaged level in the critical frequency band, the band-cut filter generates an attenuated signal having an attenuated time-averaged level in the critical frequency band that does not exceed the power threshold value.

14. The system of claim 13, wherein the frequency components of the filtered signal in the critical frequency band have a time-averaged level that does not exceed the power threshold value.

15. The system of claim 13, wherein the pass band has a width determined by the bandwidth of the critical frequency band, and the attenuation band has a width determined by the bandwidth of the critical frequency band.

16. The system of claim 13, wherein the band-cut filter varies over time, in response to variation of the time-averaged level of the band-pass filtered signal over time.

17. The system of claim 13, wherein the level determining stage is configured to measure level of the band-pass filtered signal on a time frame basis to determine said time-averaged level.

18. The system of claim 17, wherein the level determining stage is configured to measure level of the band-pass filtered signal on a time frame basis to determine said time-averaged level, including by determining a running average of one of power and energy of the band-pass filtered signal over a frame of predetermined duration.

19. The system of claim 13, wherein the level determining stage is configured to measure level of the band-pass filtered signal on a time frame basis to determine a raw, time-averaged level, and to smooth the raw, time-averaged level with predetermined attack and release time constants to determine said time-averaged level.

20. The system of claim 13, wherein said system is a loudness maximizer, also including:
- a compression stage, coupled and configured to perform dynamic range compression on at least one of the input signal and the filtered signal; and
- a limiting stage, coupled and configured to perform peak limiting on the filtered signal output generated in the band-cut filter stage.

* * * * *